United States Patent [19]

Drake

[11] 4,241,453
[45] Dec. 23, 1980

[54] CITIZENS BAND RADIO RECEIVER WITH SQUELCH CONTROL

[76] Inventor: Harlan Drake, 900 N. Western, Oklahoma City, Okla. 73106

[21] Appl. No.: 952,632

[22] Filed: Oct. 19, 1978

[51] Int. Cl.³ .............................................. H04B 1/18
[52] U.S. Cl. .................................. 455/219; 455/217; 455/225
[58] Field of Search ............... 325/397, 400, 402, 403, 325/404, 408, 362, 473, 474, 475, 476, 478, 480, 482, 65, 348; 330/83, 97, 254, 259, 278, 207 P

[56] References Cited

U.S. PATENT DOCUMENTS

| | | | |
|---|---|---|---|
| 3,140,445 | 7/1964 | Myers | 325/478 |
| 3,451,006 | 6/1969 | Grangaard, Jr. | 330/254 |
| 3,581,210 | 5/1971 | Amfahr | 325/362 |
| 3,988,694 | 10/1976 | Yamazaki | 330/207 P |
| 4,048,569 | 9/1977 | Yamatani | 330/254 |

*Primary Examiner*—Robert L. Griffin
*Assistant Examiner*—Tommy P. Chin
*Attorney, Agent, or Firm*—Robert M. Hessin

[57] ABSTRACT

Tape deck adapter apparatus for radio reception, especially for reception of citizen band transmission having widely variable noise levels. The device consists of a receiver which is adaptable for use within a conventional tape deck for energization and operation; the receiver then includes an automatic squelch control circuit of the type which is particularly useful in receiving incoming citizen band transmissions. The automatic squelch control includes reactive means controlling input to the output audio amplifier, such reactance means being controlled by a DC feedback component as derived from the audio output signal, for application to control conduction of the reactance means, and therefore, the amplification of the audio output stage.

6 Claims, 3 Drawing Figures

CITIZENS BAND RADIO RECEIVER WITH SQUELCH CONTROL

BACKGROUND OF THE INVENTION

1. Field of the Invention

The invention relates generally to radio receiver squelch control circuitry and, more particularly, but not by way of limitation, it relates to an improved automatic squelch control that is particularly adaptable for cost-reduced, all-purpose citizens band receiving equipment.

2. Description of the Prior Art

The prior art includes numerous types of squelch control circuit which have been utilized for a long period of time in control of the reception of radio receivers. In most cases, the squelch control networks operate in response to the radio frequency circuit stages of the radio receivers, and in many more sophisticated types of receiver equipment such circuitry can be quite complex, depending upon the requisite amount of control. The present invention seeks a simplified, yet reliable and effective automatic squelch control for use in hybrid-type receiver circuits such as the citizens band tape deck adapter assemblies.

SUMMARY OF THE INVENTION

The present invention contemplates automatic squelch circuit of the type using a degeneration feedback for controlling the output gain of an audio amplifier stage. Received radio energy is applied directly to the audio output stage as well as via a parallel circuit including a reactance means which provides the received signal for input in 180° phase relationship. The reactance stage is then varied in conductance by a DC component derived from the audio amplifier output and applied in feedback to control conduction of the reactive stage and therefore the input to the audio amplifier.

Therefore, it is an object of the present invention to provide a citizens band receiver squelch control circuit that functions automatically to maintain the output audio response at desirable levels of audibility.

It is also an object of the invention to provide an automatic squelch circuit for use in low cost receiver applications that is reliable and effective to maintain desired output audio level.

Finally, it is an object of the present invention to provide an improved receiver circuit for use in monitoring such as citizen band transmissions having a wide variation of signal strengths and carrier levels.

Other objects and advantages of the invention will be evident from the following detailed description when read in conjunction with the accompanying drawing which illustrates the invention.

DETAILED DESCRIPTION OF THE INVENTION

Figure 1:
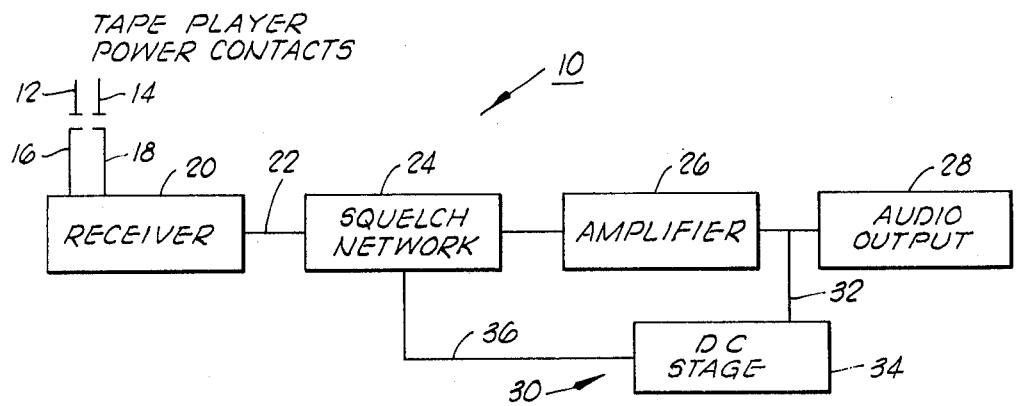
FIG. 1 is a block diagram of a tape deck receiver adapter including squelch control network as it constitutes the present invention.

FIG. 1 illustrates a receiver adapter 10 which may be disposed for operation within a conventional 8-track cartridge tape deck. Power input to adaptor 10 is applied through the tape deck contacts 12 and 14 as they contact adapter contacts 16 and 18 when the adaptor 10 is placed in operative position. The tape player power contacts 12 and 14 would normally be bridged by the sense foil on the magnetic tape cartridge when the conventional tape cartridge is utilized. Thus, power input contacts 16 and 18 provide energization to a conventional form of receiver 20, preferably of the superheterodyne type, i.e., having R-F stage, detection and I-F stages and providing audio frequency output via line 22.

Audio frequency output signals present on line 22 are then connected to a squelch network 24, as will be further described, with outputs therefrom to the output audio amplifier 26 for energization of audio output stage 28, e.g., speaker, headphones or the like. A feedback network 30 provides conduction of audio frequency output from the amplifier 26 via a line 32 to a DC stage 34 which developes a DC voltage component proportional to the audio frequency signal for application via line 36 for control of squelch network 24. As will be further described, the DC stage 34 may be any of a number of D-C limiting circuits which function to develop the requisite D-C signal of proper polarity in proportion to the audio frequency signal present on lead 32. The audio output stage 28 may be the original speaker circuit as utilized with the tape player, or it may be a specially adapted or located speaker or headphone output.

Figure 2:
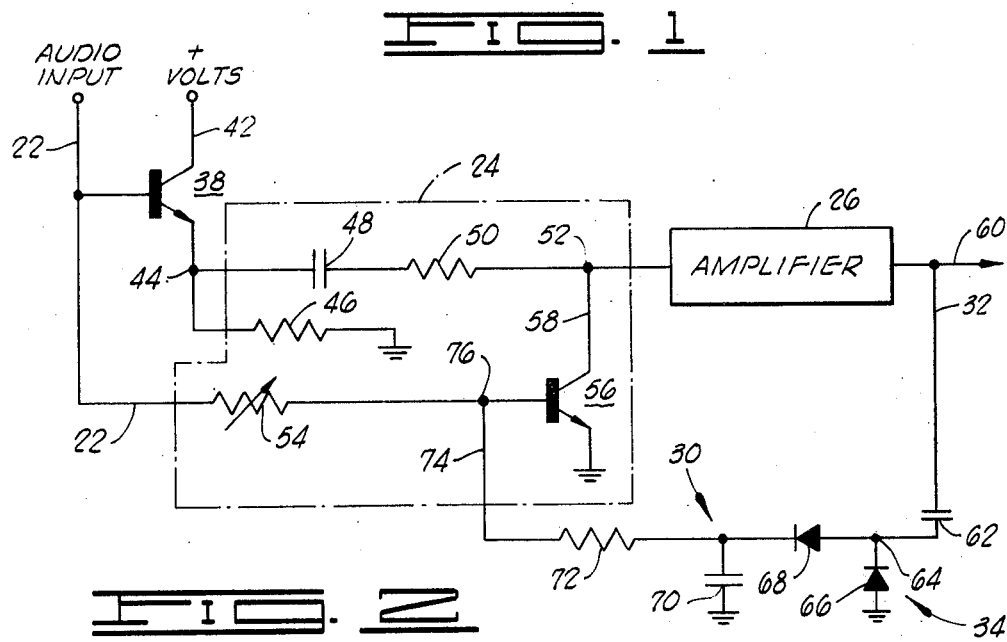
FIG. 2 is a schematic diagram illustrating the squelch network and output stages of the circuitry of FIG. 1.

Referring now to FIG. 2, audio frequency input present on lead 22 is applied to the base of an NPN transistor 38. The transistor 38 is operated common-emitter as audio frequency input is applied by lead 42 to the collector. The emitter of transistor 38 is then connected through a junction 44 and bias resistor 46 to ground. Connection from the junction point 44 is applied through a coupling capacitor 48 and series-connected resistor 50 to a junction 52 for direct input to the audio output amplifier 26. Thus, the transistor 38 serves primarily as an impedance matching input to the squelch network 24, which, in turn, controls input to the audio amplifier output stage 26.

Audio frequency signal on lead 22 from the base of transistor 38 is also applied through a variable resistor 54 to the base of an NPN transistor 56. Transistor 56 is also operated common-emitter with the emitter connected to ground and the collector 58 tied directly to junction 52 at the input of audio amplifier 26. Amplified audio frequency signal output from amplifier 26 on lead 60 is applied in normal manner to audio output 28 (FIG. 1), as well as via lead 32 to the D-C developing stage 34. Thus, lead 32 applies the feedback audio frequency signal to a capacitor 62 for input at junction 64 to a ground-connected diode 66 and a parallel diode 68 that conducts a negative D-C signal component for integration through ground-connected capacitor 70 and resistor 72.

The D-C component stage 34, in effect, consists of a differentiating limiter providing negative D-C output proportional to the audio frequency input on lead 32, and the negative D-C voltage is further smoothed through integration by capacitor 70 and resistor 72 for connection by lead 74 and junction 76 to the base of transistor 56. While a specific form of differentiating limiter is shown for development of the D-C component and feedback circuit 30, it should be understood that variations on the similar diode network circuitry may be utilized so long as the necessary proportional D-C component is developed. One design of the present receiver-automatic squelch circuitry utilizes the well-known voltage doubling effect in the diode network in order to provide still greater reliability of gain threshold control operation.

In operation, audio frequency signal input is applied through emitter follower 38, coupling capacitor 48 and resistor 50 for input to the audio amplifier 26 with output energization via lead 60 to audio output 28. The same audio frequency signal input (lead 22) is also applied through a gain control adjustment potentiometer 54 to the base of transistor 56, also connected common-emitter. Thus, the collector output current from transistor 56 will be a counterpart signal at 180° out of phase with the audio frequency current passing through capacitor 48 and resistor 50 and present at junction 52. The control potentiometer 54 is preferably adjusted so that current at the base of transistor 56 will maintain transistor 56 conductive to provide a low or balanced audio frequency signal at the collector of transistor 56 (on lead 58). Thus, it is desired that the input on lead 58 be maintained as a low audio frequency signal applied in phase-opposed relationship to amplifier 26. A tolerable amount of phase-opposition. But, with poor signal, and proportionately more positive feedback control voltage at junction 76, the transistor 56 conducts more heavily to place greater phase-opposed signal at junction 52 thereby to degrade or completely negate input to amplifier 26 and to squelch the audio.

Thus, whenever an excessive or strong audio frequency output signal is present on output lead 60 from amplifier 26, the signal is conducted by lead 32 across the D-C state 34 to produce a strong negative D-C complement signal which is then applied via resistor 72 to junction 26 and the base of transistor 56. A sufficiently strong negative feedback signal creates unbalance and renders transistor 56 non-conductive thereby to maintain high amplitude of the audio frequency signal input to amplifier 26. That is, as transistor 56 is rendered non-conductive, and no output current flows into lead 58 to junction 52, the out-of-phase degeneration at the input to amplifier 26 is not effective and full audio frequency input signal from junction point 44 is applied as input to amplifier 26. Adjustment of the gain control potentiometer 54 will set the amplitude of the out-of-phase suppression signal as generated through transistor 56 so that audio frequency output from amplifier 26 will remain in a desired amplitude range.

Figure 3:
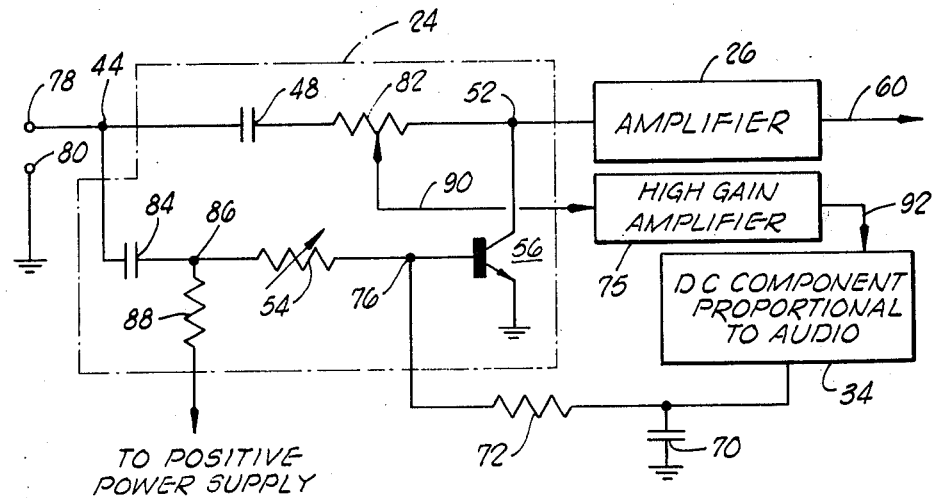
FIG. 3 is a schematic diagram of an alternative form of the squelch network and output stages of FIG. 1.

FIG. 3 illustrates an alternative embodiment of the similar squelch control network 24 and output audio amplifier 26. Similar components are numbered the same and the only actual variation from the FIG. 2 embodiment is the elimination of the impedance matching input or transistor 38, and the addition of a high gain amplifier 75 for the purpose of enabling total cessation of amplification and output from audio output amplifier 26. Thus, audio frequency signal input from an audio source of suitable impedance may be applied at input terminals 78 and 80 with audio frequency signal present at junction point 44. The AF signal is then applied through the coupling capacitor 48 and potentiometer 82 for input to the audio output amplifier 26. The out-of-phase signal is derived from connection to junction point 44 through a coupling capacitor 84 and junction point 86 through the control potentiometer 54 to the base of transistor 56. The junction point 86 is biased by resistor 88 to the positive power supply of the system. Thus, transistor 56 generates a replica signal that is 180° out of phase from the original audio frequency input signal, amplitude being selectively adjusted by the control potentiometer 54. Development of the D-C feedback signal is taken from potentiometer 82 by means of lead 90 for input and amplification in audio frequency high gain amplifier 75, a conventional form of transistor amplifier capable of wide gain variation, to produce an output signal on a lead 92 for processing in the D-C stage 34 thereby to develop the negative D-C control signal proportional to the instantaneous audio frequency signal. Output from D-C stage 34 is then applied through the integrator comprised of capacitor 70 and resistor 72 to the junction 76 for base control of transistor 56.

The operation of the FIG. 3 embodiment is the same as that for the circuit shown in FIG. 2; however, the inclusion of a separate high gain amplifier 75, for processing of the audio frequency signal and development of the negative D-C feedback signal, enables a greater range of negative feedback signals so that audio frequency output can be completely squelched during periods of strong or excessive signal strength. The adjustment of potentiometer 82 will enable the operator to set the level at which complete squelch or muting of the audio output is effective.

The foregoing discloses a novel automatic squelch circuit of cost reduced character that is particularly effective as used in low power citizens band receiving equipment, and particulary those types which are called upon to receive such as walkie-talkie transmission and the like. While the circuit description and operation have been set forth with particular specification of NPN transistors and negative control voltage development in the D-C feedback stage, it should be understood that the circuit is entirely adaptable for performance with type PNP transistors and corresponding reversed polarity of voltages, including the changing to a positive feedback control voltage from the D-C stage 34.

Changes may be made in the combination and arrangement of elements as heretofore set forth in the specification and shown in the drawings; it being understood that changes may be made in the embodiments disclosed without departing from the spirit and scope of the invention as defined in the following claims.

What is claimed is:

1. In combination with a radio receiver of the type adaptive for operation in an eight-track record tape deck and consisting of a receiver section providing audio frequency signal output, an audio frequency amplifier and an audio output, an automatic squelch control circuit comprising:

means receiving said audio frequency signal output to provide first input to said audio frequency amplifier;

amplifier means receiving said audio frequency signal output and generating second input to said audio frequency amplfier that is additive with said first input and in phase opposition thereto;

rectifier means receiving the output of said audio frequency amplifier to develop a D-C control signal proportional to said output; and means applying said D-C control signal as input to said amplifier means, whereby excessive input signals to said audio frequency amplifier will proportionately reduce the amplifier means second input to said audio frequency amplifier to provide relatively greater amplitude for input thereto.

2. A circuit as set forth in claim 1 wherein said means receiving said audio frequency signal output comprises:
transistor means operated common-emitter and providing emitter output for impedance matched input to said audio frequency amplifier.

3. A circuit as set forth in claim 1 wherein said amplifier means comprises:
transistor means operated common-emitter with said audio frequency signal output applied to the base and with the collector providing said second input to said audio frequency amplifier, and with said D-C control signal also being applied to the base.

4. A circuit as set forth in claim 3 which is further characterized to include:
potentiometer means interconnected between the transistor means base input and said audio frequency signal output to adjust the input signal amplitude to said transistor means base and provide a desired amplitude balance between said first and second phase-opposed input to said audio frequency amplifier.

5. A circuit as set forth in claim 1 which further includes:
integrating means receiving said D-C control signal from said rectifier means for application to the said input of said amplifier means.

6. In combination with a radio receiver of the type adaptive for operation in an eight-track record tape deck and consisting of a receiver section providing audio frequency signal output, an audio frequency amplifier and an audio output, an automatic squelch control circuit comprising:
means receiving said audio frequency signal output to provide first input to said audio frequency amplifier;
amplifier means receiving said audio frequency signal output and generating second input to said audio frequency amplifier that is additive with said first input and in phase opposition thereto;
high gain amplifier means receiving input of said audio frequency signal output to generate a control output;
rectifier means receiving the control output from said high gain amplifier to develop a D-C control signal proportional to said output; and
means applying said D-C control signal as input to said amplifier means, whereby excessive input signals to said audio frequency amplifier will proportionately reduce the amplifier means second input to said audio frequency amplifier to provide relatively greater amplitude for input thereto.

* * * * *